US007970982B2

(12) United States Patent
Kim et al.

(10) Patent No.: US 7,970,982 B2
(45) Date of Patent: Jun. 28, 2011

(54) MEMORY CARD AND MEMORY SYSTEM HAVING THE SAME

(75) Inventors: Ki-Hong Kim, Suwon-si (KR); Byeong-Hoon Lee, Seoul (KR); Seung-Won Lee, Seongnam-si (KR); Sun-Kwon Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 748 days.

(21) Appl. No.: 11/761,620

(22) Filed: Jun. 12, 2007

(65) Prior Publication Data

US 2008/0189474 A1 Aug. 7, 2008

(30) Foreign Application Priority Data

Feb. 6, 2007 (KR) ........................ 10-2007-0012274

(51) Int. Cl.
*G06F 12/02* (2006.01)
(52) U.S. Cl. ........................ 711/103; 711/156
(58) Field of Classification Search .................. None
See application file for complete search history.

(56) References Cited

U.S. PATENT DOCUMENTS

| 5,848,428 | A * | 12/1998 | Collins .......................... 711/127 |
| 6,426,893 | B1 * | 7/2002 | Conley et al. ............. 365/185.11 |
| 7,137,011 | B1 * | 11/2006 | Harari et al. .................. 713/189 |
| 2005/0015539 | A1 | 1/2005 | Horii et al. |
| 2006/0027906 | A1 | 2/2006 | Hsu et al. |
| 2006/0171126 | A1 | 8/2006 | Tzu |

FOREIGN PATENT DOCUMENTS

| JP | 07-078228 | 3/1995 |
| JP | 11-176178 | 7/1999 |
| JP | 2000-207137 | 7/2000 |
| JP | 2001-307059 | 1/2001 |
| KR | 1020020071710 A | 9/2005 |
| KR | 1020050097300 A | 10/2005 |
| KR | 1020060129804 A | 12/2006 |

* cited by examiner

Primary Examiner — Gary J Portka
(74) Attorney, Agent, or Firm — F. Chau & Associates, LLC (57) ABSTRACT

A memory card includes: a first memory chip responding to all commands input externally; and a second memory chip responding to commands, among the commands input externally, relevant to reading, programming, and erasing operations with data. Card identification information stored in the first memory chip includes capacity information corresponding to a sum of sizes of the first and second memory chips. The plurality of memory chips of the memory card are useful in designing the memory card with storage capacity in various forms.

36 Claims, 8 Drawing Sheets

Fig. 1

(Prior Art)

Fig. 2

(Prior Art)

MEMORY CARD AND MEMORY SYSTEM HAVING THE SAME

CROSS-REFERENCE TO RELATED APPLICATION

This U.S. non-provisional patent application claims priority under 35 U.S.C. §119 of Korean Patent Application No. 2007-12274 filed on Feb. 6, 2007, the entire contents of which are hereby incorporated by reference.

BACKGROUND

The present disclosure relates to semiconductor memories. More specifically the present disclosure relates to flash memories and a memory card system including the same.

Multimedia cards (MMCs) are kinds of communication media and data storage units generally used in low-priced devices intended for normal users. MMCs are usually designed to be operable in various applications, such as smart phones, cameras, personal data assistants (PDAs), digital recorders, MP3 players, pagers, and so forth. MMCs are nowadays regarded as being characterized by high portability and good performance with low prices.

Figure 1:
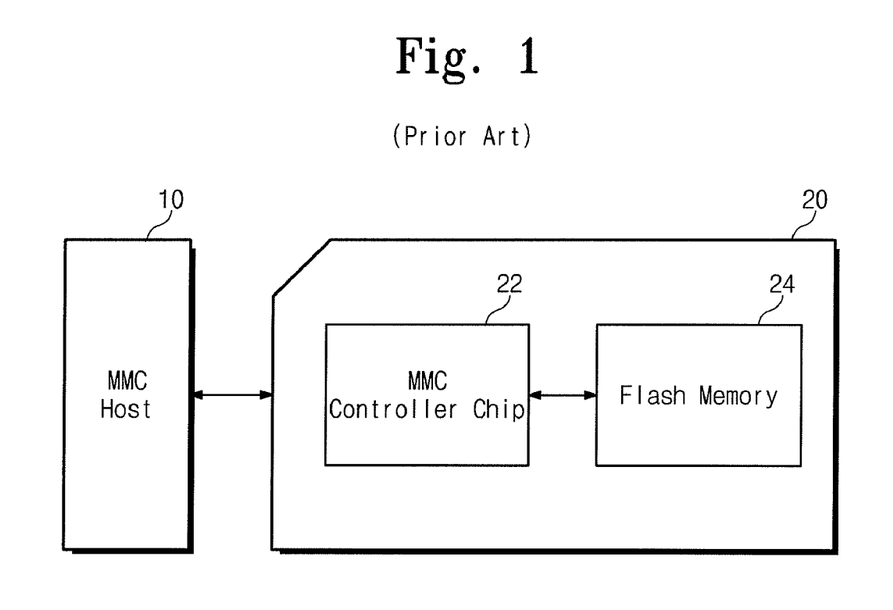
FIG. 1 is a schematic block diagram of a general multimedia card.

FIG. 1 is a schematic block diagram of a general multimedia card.

Referring to FIG. 1, the MMC 20 includes an MMC controller chip 22 and a flash memory 24. The MMC controller chip 22 and the flash memory 24 are each constructed as independent chips. In other words, the MMC 20 is composed of two chips. The flash memory 24 is formed in a NAND type that is well known in this art. The MMC controller chip 22 functions to conduct interfacing operations between a host 10 and the flash memory 24.

As the MMC 20 is organized of two chips, the cost is increased for fabricating the MMC 20. Further, data security would be worse due to exposure of data that is transceived between the MMC controller chip 22 and the flash memory 24.

Figure 2:
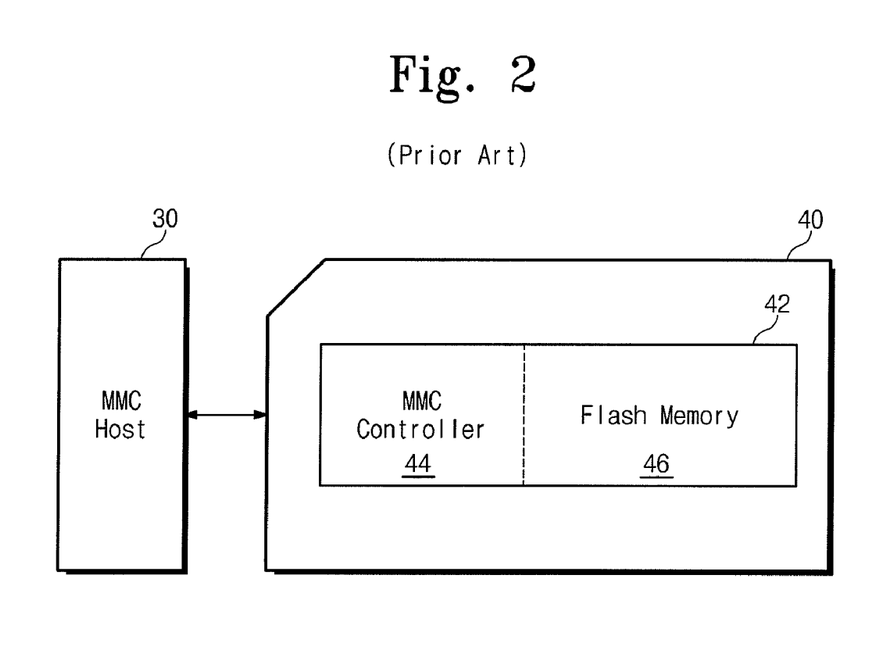
FIG. 2 is a schematic block diagram of a one-chip multimedia card.

With the object of solving those problems, a way of fabricating a one-chip MMC 40 has been recently proposed, as illustrated in FIG. 2. In the MMC 40, an MMC controller 44 and a flash memory 46 are integrated in a single memory chip 42. Since the one-chip MMC 40 can be structured without pads and signal lines for connecting the MMC controller 44 with the flash memory 46, it makes the chip area smaller and can be produced at a lower cost. Moreover, without exposure of data transferred between the MMC controller 44 and the flash memory 46, it enhances the data security.

Generally, wide-scope applications and diverse users usually require MMCs that are variable in storage capacities. If a number of the flash memories 24 are provided in the MMC 20 shown in FIG. 1 and changes made to a firmware of the MMC controller 22, a capacity of the MMC 20 may be variable.

It is not easy, however, for the MMC 40 to vary the storage capacity of the flash memory. To change a storage capacity of the flash memory, it is required to fabricate a memory chip using newly designed circuit patterns and providing plural memory chips to the MMC. In organizing an MMC with pluralities of memory chips, there needs to be considered an interface pattern between a host and the MMC.

SUMMARY OF THE INVENTION

Exemplary embodiments of the present invention are directed to provide a memory card with a plurality of memory chips and a memory system including the same.

An exemplary embodiment of the present invention is a memory card being comprised of: a first memory chip responding to all commands input externally; and a second memory chip responding to commands, among the commands input externally, relevant to reading, programming, and erasing operations with data. Card identification information stored in a first memory chip includes capacity information corresponding to a sum of the sizes of the first and second memory chips.

The second memory chip stores the same card identification information as the first memory chip.

In an exemplary embodiment, the first memory chip is comprised of: a first flash memory; and a first controller operating to control the first flash memory.

In an exemplary embodiment, the first flash memory is comprised of: a memory cell array; and a peripheral block configured to control reading, programming, and erasing operations of the memory cell array by the first controller.

In an exemplary embodiment, the memory cell array of the first flash memory stores the card identification information.

According to an exemplary embodiment, the first controller is comprised of a register for storing the card identification information read out by a peripheral block at a power-up time.

In an exemplary embodiment, the first controller of the first memory chip outputs the card identification information externally of the MMC in response to a command input externally.

According to an exemplary embodiment, the first controller is comprised of: a CPU; a host interface configured to communicate externally in an multimedia card interface mode under control of a CPU; a flash interface configured to control the peripheral block under control of the CPU; and a buffer RAM connected between the host interface and flash interface and configured to temporarily store transmission data.

In an exemplary embodiment, the second memory chip is comprised of: a second flash memory; and a second controller operating to control the second flash memory.

According to an exemplary embodiment, the second flash memory is comprised of: a memory cell array; and a peripheral block configured to control reading, programming, and erasing operations of the memory cell array by the second controller.

In an exemplary embodiment, the memory cell array of the second flash memory stores the card identification information.

In an exemplary embodiment, the second controller of the second memory chip is comprised of a register for storing the card identification information read out by the peripheral block at a power-up time.

The second controller is comprised of: a CPU; a host interface configured to communicate externally in an multimedia card interface mode under control by the CPU; a flash interface configured to control a peripheral block under control by the CPU; and a buffer RAM connected between the host interface and a flash interface and configured to temporarily store transmission data.

An exemplary embodiment of the present invention provides a memory system being comprised of: a host; and a multimedia card configured to communicate with the host. The multimedia card is comprised of a first memory chip responding to all commands input from the host; and a second memory chip responding to commands, among the commands input from the host, relevant to writing and reading operations with data. Card identification information stored in the first memory chip includes capacity information corresponding to a sum of the sizes of the first and second memory chips.

In an exemplary embodiment, the second memory chip stores the same card identification information as the first memory chip.

Each of the first and second memory chips is comprised of: a flash memory; and a controller operating to control the flash memory.

According to an exemplary embodiment, the flash memory is comprised of: a memory cell array; and a peripheral block configured to control reading, programming, and erasing operations of the memory cell array by the controller.

In an exemplary embodiment, the memory cell array stores the card identification information.

In an exemplary embodiment, the controller is comprised of a register for storing the card identification information read out by the peripheral block at a power-up time.

According to an exemplary embodiment, the host provides the multimedia card with a command for reading the card identification information in a card identification mode, and the first memory chip of the multimedia card outputs the card identification information to the host in response to the read command provided from the host.

The controller comprises a ROM storing firmware to control the flash memory.

In an exemplary embodiment, the host provides the multimedia card with an address while accessing the multimedia card. The controller operates to control access to a memory cell array corresponding to the address if the address provided from the host belongs to a first address group. The controller operates to control access to a memory cell array corresponding to the address if the address provided from the host belongs to a second address group.

In an exemplary embodiment, the first address group includes odd-ordered addresses and the second address group includes even-ordered addresses.

Exemplary embodiments of the present invention may also provide a method of operating a memory system having a host and a multimedia card including first and second memory chips. The method includes the steps of: connecting the multimedia card to the host; transferring card identification information to the host from the first memory chip of the multimedia card; and executing a reading, programming, or erasing operation of the first or/and second memory chips under control of the host. Card identification information stored in the first memory chip includes capacity information corresponding to a sum of the sizes of the first and second memory chips.

In an exemplary embodiment, the second memory chip stores the same card identification information as the first memory chip.

In an exemplary embodiment, each of the first and second memory chips is a flash memory chip.

According to an exemplary embodiment, the method further includes the step of converting an address, which is provided from the host, into a first address for accessing the first memory chip if the address provided from the host belongs to a first address group.

According to an exemplary embodiment, the method further includes the step of converting an address, which is provided from the host, into a first address for accessing the second memory chip if the address provided from the host belongs to a second address group.

In an exemplary embodiment, the first address group includes odd-ordered addresses and the second address group includes even-ordered addresses.

A further understanding of the nature and advantages of the exemplary embodiments of the present invention herein may be realized by reference to the remaining portions of the specification and the attached drawings.

BRIEF DESCRIPTION OF THE FIGURES

Exemplary embodiments of the present invention will be understood in more detail from the following descriptions taken in conjunction with the accompanying figures. In the figures.

DETAILED DESCRIPTION OF EXEMPLARY EMBODIMENTS

Exemplary embodiments of the present invention will be described below in more detail with reference to the accompanying drawings. The present invention may, however, be embodied in different forms and should not be constructed as limited to the exemplary embodiments set forth herein. Rather, these exemplary embodiments are provided so that this disclosure will be thorough and complete, and will fully convey the scope of the present invention to those of ordinary skill in the art. Like reference numerals refer to like elements throughout the accompanying figures.

Figure 3:
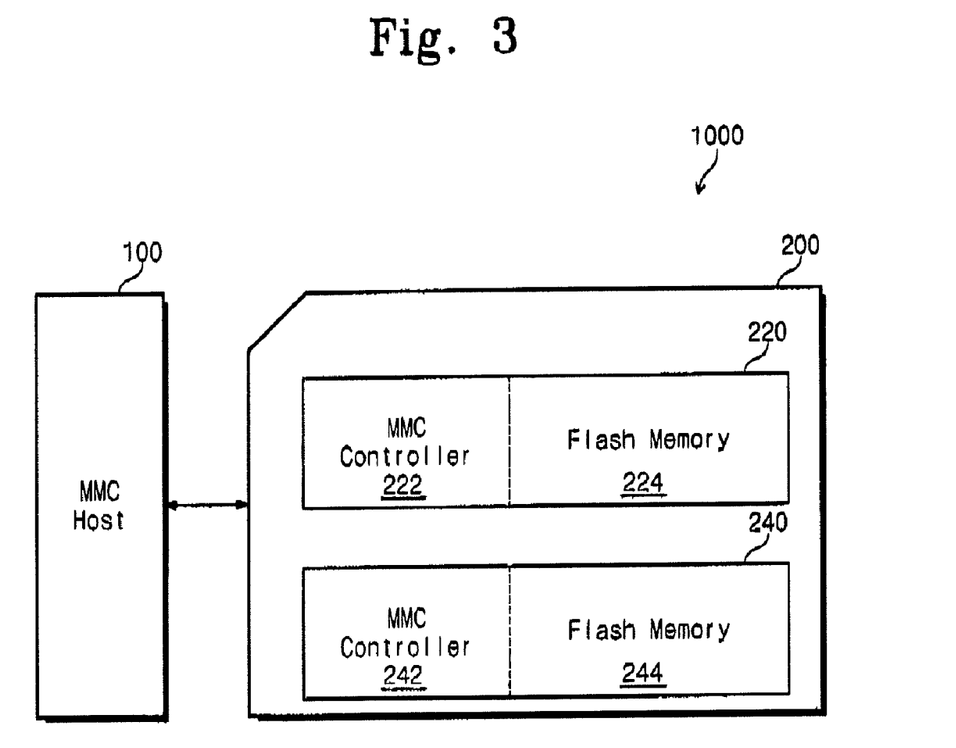
FIG. 3 is a block diagram of a memory system including a multimedia card in accordance with an exemplary embodiment of the present invention.

FIG. 3 is a block diagram of a memory system including a multimedia card in accordance with an exemplary embodiment of the present invention.

Referring to FIG. 3, the memory system 1000 is comprised of an MMC host 100 and an MMC 200. The MMC 200 according to an exemplary embodiment of the present invention is designed to communicate with the MMC host 100 in an MMC interface mode. This means that the MMC 200 is used as a multimedia card. The MMC 200 includes first and second memory chips 220 and 240. The first memory chip 220 includes an MMC controller 222 and a flash memory 224, formed as a single chip. The second memory chip 240 also includes an MMC controller 242 and a flash memory 244, formed as a single chip. A memory cell array (not shown) contains firmware for managing the flash memory. The structure and operation of the first memory chip 220 will be representatively described hereinafter, since there is a similarity between the first and second memory chips 220 and 240.

The MMC 200 shown in FIG. 3 is organized including the two memory chips 220 and 240. Those memory chips 220 and 240 store the same chip identification (ID). Capacity information provided to the MMC host 100 from the first memory chip 220 is a sum of storage capacities of the flash memories 224 and 244. The flash memories 224 and 244 are accessed by addresses that are different from each other. The MMC host 100 accesses the MMC 200 in the same mode of making a connection with an MMC having a single flash memory that corresponds to the sum of the capacities of the flash memories 224 and 244.

Figure 4:
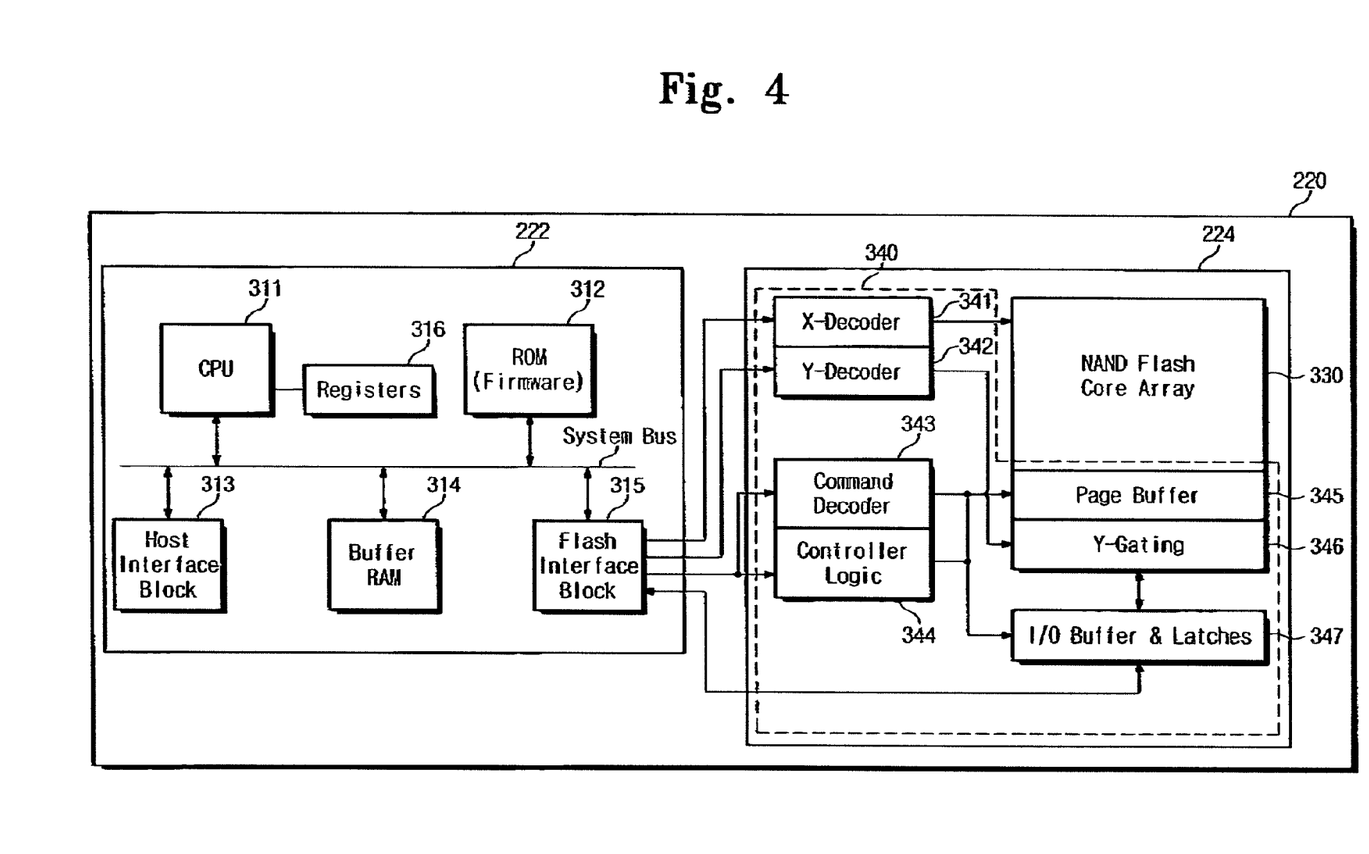
FIG. 4 is a block diagram concretely illustrating a functional structure of a first memory chip of the system shown in FIG. 3.

FIG. 4 is a block diagram illustrating a functional structure of the first memory chip 220 shown in FIG. 3.

Referring to FIG. 4, the MMC controller 222 of the first memory chip 220 is comprised of a central processing unit (CPU) 311, a ROM 312, a host interface 313, a buffer RAM 314, a flash interface block 315, and registers 316 connected to the CPU 311. The ROM 312 stores firmware for managing the flash memory 224. The CPU 311 operates in response to a command transferred through the host interface 313 over the system bus and manages the flash memory 224 by means of the firmware stored in the ROM 312. The ROM 312 stores a card firmware code.

The host interface 313 provides an interface operation with the host 100 of FIG. 3. For instance, the host interface 313 converts serial data/addresses, which are transferred from the host 100, into parallel data/addresses. The flash interface block 315 provides an interface operation with the flash memory 224. The flash interface block 315 is controlled by the CPU 311 and configured to generate control signals and addresses necessary for reading, programming, and erasing operations. The flash interface block 315 is designed, for example, to control timings in reading, programming, and erasing operations of the flash memory 224.

The buffer RAM 314 is used as a work RAM of the CPU 311. The buffer RAM 314 is also used for provisionally storing data transferred between the host 100 of FIG. 3 and the flash memory 224. The host 100 and the MMC 200 are configured to operably communicate by way of various interface devices (not shown), such as peripheral component interconnect (PCI), universal serial bus (USB), and so on.

As shown in FIG. 4, the flash memory 224 includes a memory cell array 330 and a peripheral block 340. A specific field of the memory cell array 330 stores a card ID and operation parameters, for example, a flash memory size, the maximum data access time, a data transmission rate, and so on. The card ID and operation parameters stored in the specific field of the memory cell array 330 are stored into the registers 316 of the MMC controller 222 at a power-up time under control of the CPU 311.

The peripheral block 340 conducts reading, programming, and erasing operations by the MMC controller 222. The peripheral block 340 is arranged to include row and column decoders 341 and 342, a command decoder 343, a control logic unit (controller logic) 344, a page buffer circuit 345, a column gate circuit (Y-gating) 346, and input/output buffer and latch circuit (I/O buffer and latches) 347. The elements of the peripheral block 340 are well known by those of ordinary skill in this art, so will not be described further.

The chip ID and operation parameters stored in the registers 316 of the first memory chip 220 are identical to those stored in registers (not shown) of the second memory chip 240 of FIG. 3. Therefore, a card identification mode, in which at a power-up time the MMC host 100 requests the chip ID and operation parameters of the MMC 200, can succeed by providing card identification information to the MMC host 100 from any one of the first, and second memory chips 220 and 240. In this exemplary embodiment of the present invention, setting the first memory chip 220 as a primary chip, the first memory chip 220 responds to a request for card identification information by the host 100 shown in FIG. 3.

The host 100 outputs addresses to the MMC 200 in a packet mode with reference to an MMC protocol. The MMC 200 executes a reading, programming, or erasing operation with addresses provided from the host.

A group of addresses provided from the host 100 is mapped to the flash memory 224 of the first memory chip 220, while the other group is mapped to the flash memory 244 of the second memory chip 240. This address mapping scheme is accomplished by MMC controllers 222 and 242.

Figure 5:
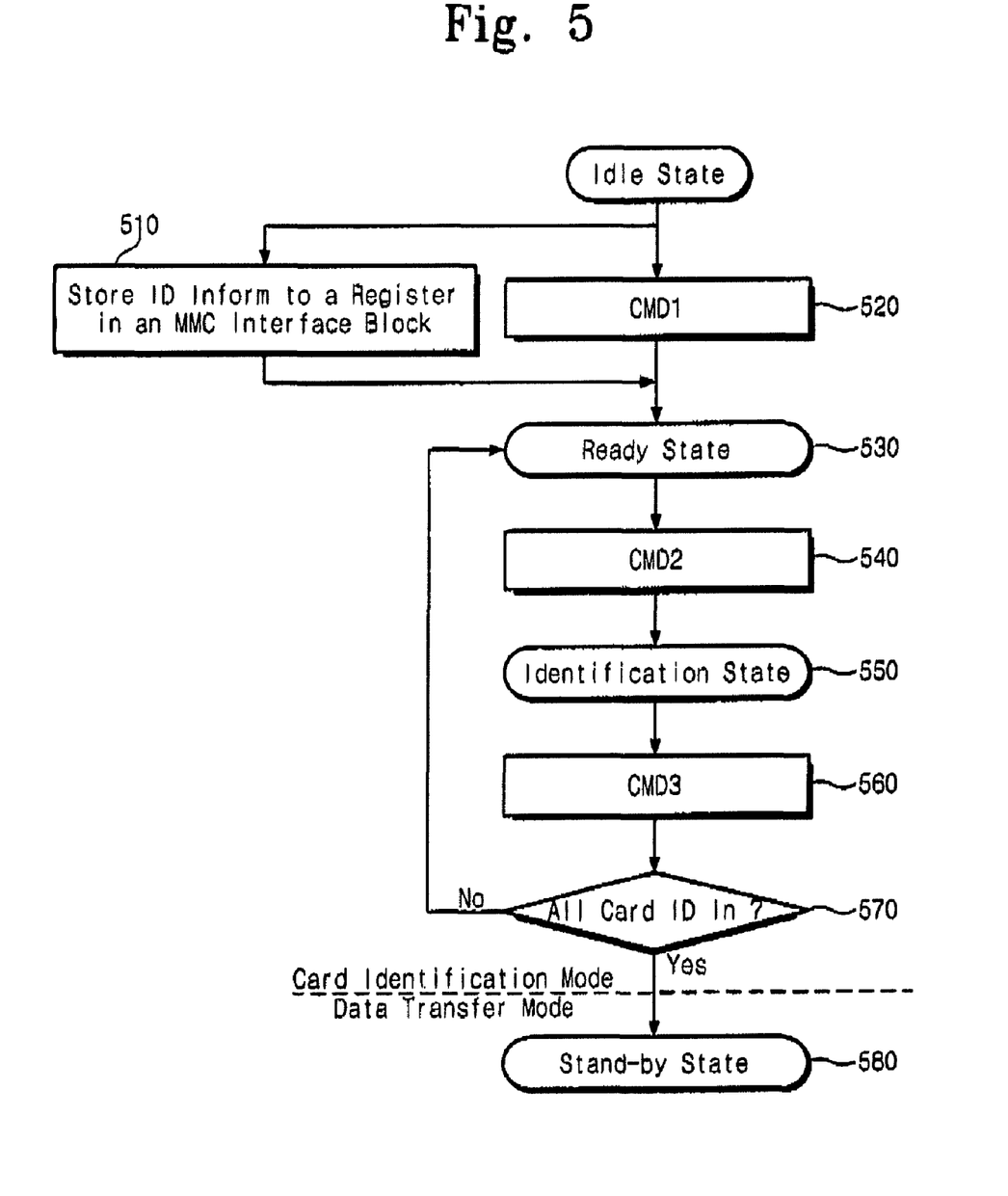
FIG. 5 is a flow chart showing an operation of a memory card system according to an exemplary embodiment of the present invention.

FIG. 5 is a flow chart showing an operation of the MMC controller 222 in the first memory chip 220 of the memory card system according to an exemplary embodiment of the present invention. Hereinafter will be detailed the operation of the MMC controller 222 in the first memory chip 220 according to an exemplary embodiment of the present invention.

As well known, if the MMC 200 links to the host 100, power is supplied into the MMC 200 from the host. Once power is supplied to the MMC 200, the MMC 200 is put into a well-known card identification mode. While power is being supplied to the first memory chip 220 of the MMC 200, the card ID and operation parameters stored in the memory cell array 330 are stored into the registers 316 under control of the CPU 311 (step 510). The card ID and operation parameters stored in the registers 316 are transferred to the host 100 in accordance with a known process in the card identification mode. Upon issuing a first command CMD1 520, the ready state 530 is set and, upon issuing a second command CMD2 540, an identification state 550 is set. Then, upon issuing a third command CMD3 560, a decision 570 is made whether all of the card ID is in. Steps 520~570 of FIG. 5 are arranged to conduct the card identification mode. As the card identification mode is well known in this art, it will not be described further.

If the card identification mode is terminated, the first memory chip 220 of the MMC 200 is put into a stand-by state for a data transfer mode (step 580). During the data transfer mode, the flash memory 224 is managed by the MMC controller 222.

Figure 6:
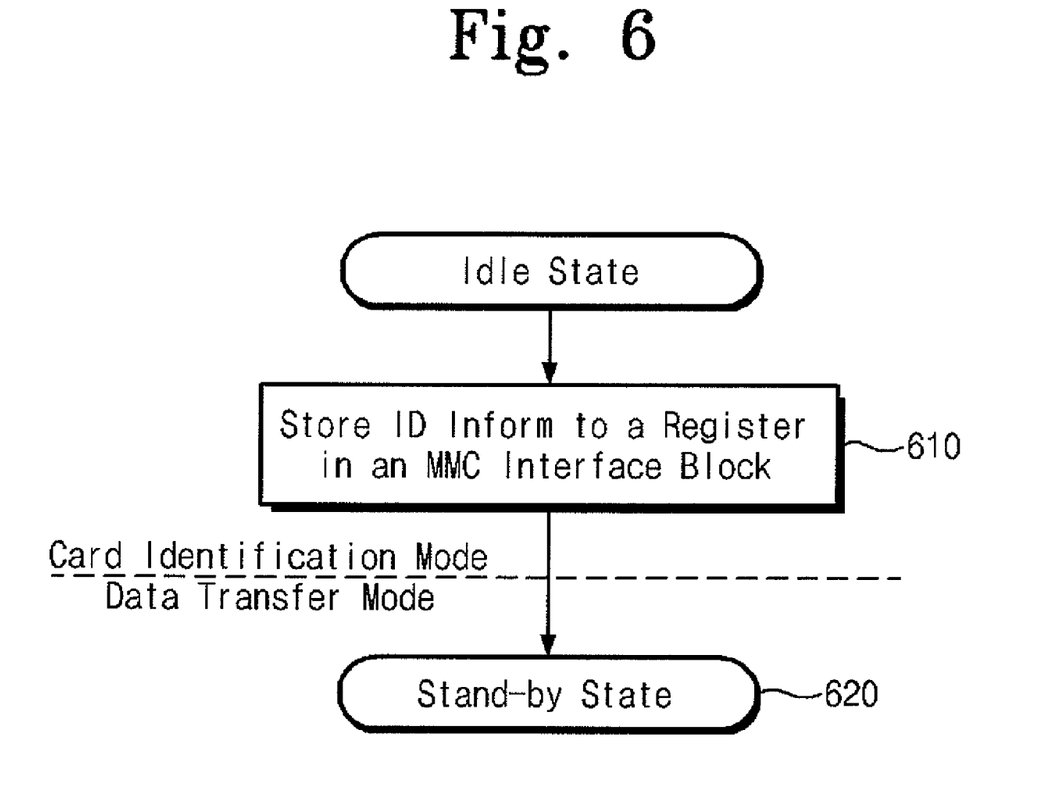
FIG. 6 is a flow chart, showing an operation of a multimedia card controller of a second memory chip in the memory card system according to an exemplary embodiment of the present invention.

FIG. 6 is a flow chart showing an operation of the MMC controller 242 in the second memory chip 240 of the memory card system according to an exemplary embodiment of the present invention.

Referring to FIGS. 4 and 6, if power is supplied to the MMC 200, the second memory chip 240 of the MMC 200 is put into a card identification mode together with the first memory chip 220. While power is being supplied to the second memory chip 240, the card ID and operation parameters stored in the memory cell array 330 of the flash memory 244 are stored into registers 316 under control of the CPU 311 of the MMC controller 242 (step 610). The card ID and operation parameters about the second memory chip 240 are not transferred to the host 100, because those are identical to the card ID and operation parameters of the first memory chip 220 that have already been transferred.

If the card identification mode is terminated, the second memory chip 240 of the MMC 200 is put into a stand-by state for a data transfer mode (step 620). During the data transfer mode, the flash memory 244 is managed by the MMC controller 242.

The host 100 outputs addresses to the MMC 200 for reading, programming, and erasing operations. The controller 222 of the MMC 200 operates to control a reading, programming, or erasing operation correspondent to a command input from the host 100 when an address supplied from the host 100 belongs to a group of addresses for designating the flash memory 224. The controller 242 of the MMC 200 operates to control a reading, programming, or erasing operation corresponding to a command input from the host 100 when an address supplied from the host 100 belongs to the other group of addresses for designating the flash memory 244.

Figure 7:
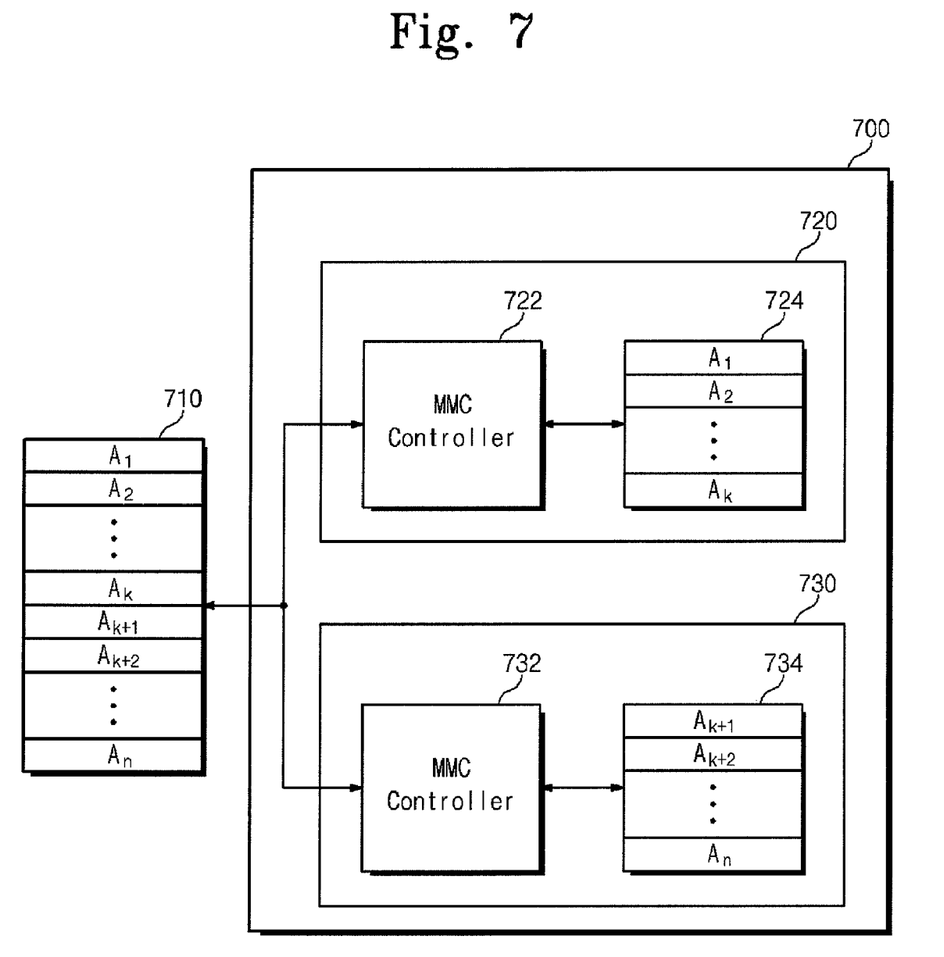
FIG. 7 is a schematic diagram illustrating a feature of designating flash memories in two memory chips by means of an address input from a host.

FIG. 7 is a schematic diagram illustrating a feature of designating flash memories in two memory chips by means of an address input from a host.

Referring to FIG. 7, a group of addresses $A_1 \sim A_k$ among addresses $A_1 \sim A_n$ provided from a host 710 is used for designating a flash memory 724 of a first memory chip 720, while the other group of address $A_{k+1} \sim A_n$ among the addresses $A_1 \sim A_n$ provided from the host 710 is used for designating a flash memory 734 of a second memory chip 730.

An MMC controller 722 of the first memory chip 720 operates to control a reading, programming, or erasing operation corresponding to a command input from the host 710 when an address supplied from the host 710 belongs to the address group of $A_1 \sim A_k$. An MMC controller 732 of the second memory chip 730 operates to control a reading, programming, or erasing operation corresponding to a command input from the host 710 when an address supplied from the host 710 belongs to the other address group of $A_{k+1} \sim A_n$.

Figure 8:
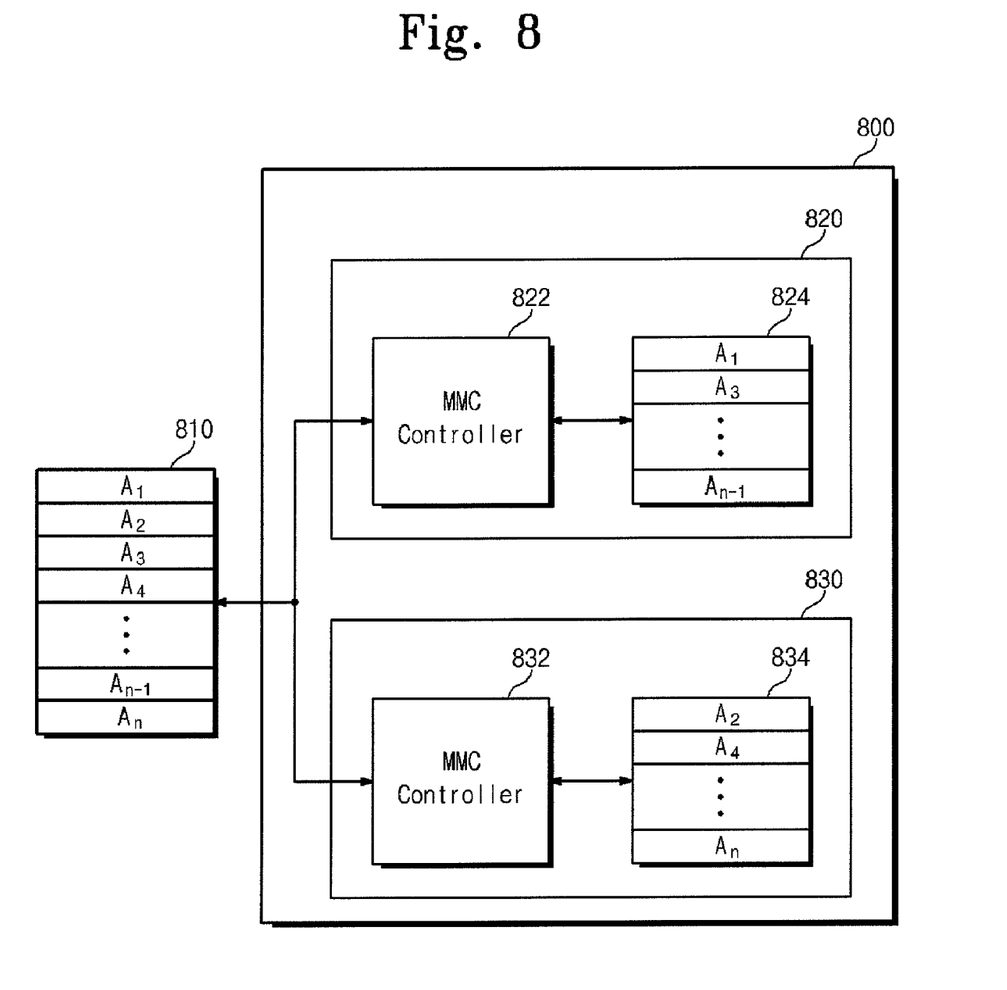
FIG. 8 is a schematic diagram illustrating a feature of designating flash memories in two memory chips in an interleaving mode by means of an address input from a host.

FIG. 8 is a schematic diagram illustrating a feature of designating flash memories in two memory chips in an interleaving mode by means of an address input from a host.

Referring to FIG. 8, odd-ordered addresses $A_1, A_3, \ldots,$ and $A_{n-1}$ among addresses $A_1 \sim A_n$ provided from a host 810 are used for designating a flash memory 824 of a first memory chip 820, while the even-ordered address $A_2, A_4, \ldots,$ and $A_n$ among the addresses $A_1 \sim A_n$ provided from the host 810 are used for designating a flash memory 834 of a second memory chip 830.

An MMC controller 822 of the first memory chip 820 operates to control a reading, programming, or erasing operation corresponding to a command input from the host 810 when an address supplied from the host 810 belongs to the odd-ordered addresses $A_1, A_3, \ldots,$ and $A_{n-1}$. An MMC controller 832 of the second memory chip 830 operates to control a reading, programming, or erasing operation corresponding to a command input from the host 810 when an address supplied from the host 810 belongs to the even-ordered addresses $A_2, A_4, \ldots,$ and $A_n$.

As such, when the host 810 accesses the flash memories 824 and 834 in the interleaving mode, there may be an overlap between timings of accessing the flash memories 824 and 834 by the host 810 and, hence, this provides an improvement of a data transmission rate between the host 810 and the MMC 800.

In an exemplary embodiment, the flash memories of two memory chips may be divided into the units of a page or a block. As an example, the first memory chip is accessed if an address input from the host corresponds to an address for designating an odd-ordered page, while the second memory chip is accessed if an address input from the host corresponds to an address for designating an even-ordered page. Otherwise, the first memory chip is accessed if an address input from the host corresponds to an address for designating a group of pages in order of 1, 2, 5, 6, 9, . . . , while the second memory chip is accessed if an address input from the host corresponds to an address for designating the other group of pages in order of 3, 4, 7, 8, 11, 12, . . . As such, this interleaving mode wherein the host accesses the flash memories may generate an overlap between timings of accessing the flash memories by the host, so it improves data transmission rate between the host and the MMC.

Figure 9:
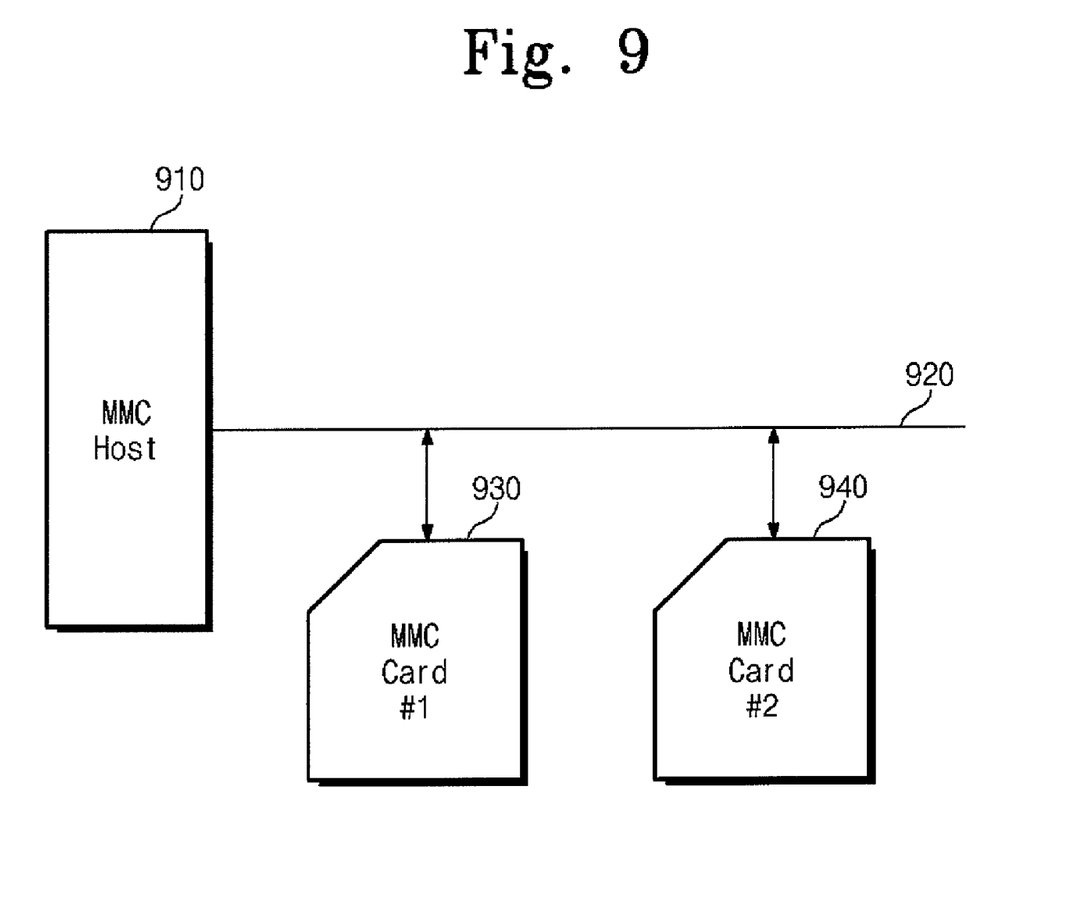
FIG. 9 is a block diagram of a memory system according to an exemplary embodiment of the present invention.

FIG. 9 is a block diagram of a memory system according to an exemplary embodiment of the present invention.

Referring to FIG. 9, the memory system is organized including an MMC host 910, and MMCs 930 and 940 coupled to the host 910 through an MMC bus 920. The MMCs 930 and 940 coupled to the MMC bus 920 store the same card ID. A primary card, among the MMCs 930 and 940, provides the host 910 with card identification information that includes data corresponding to a sum of the storage capacities of the MMCs 930 and 940. Therefore, the host 910 generates signals for accessing the MMCs 930 and 940 as same as the case that the MMC bus is coupled to an MMC including a single memory corresponding to a sum of the storage capacities of the MMCs 930 and 940.

Each of the MMCs 930 and 940 includes an MMC controller (not shown) and a flash memory (not shown). The controller of the MMC 930 operates to control a reading, programming, or erasing operation corresponding to a command input from the host 910 when an address supplied from the host 910 belongs to a group of addresses. The controller of the MMC 940 operates to control a reading, programming, or erasing operation corresponding to a command input from the host 910 when an address supplied from the host 910 belongs to the other group of addresses.

According to such an MMC system, it is possible to obtain, by coupling two or more MMCs to the MMC bus 920, the same effect as the case of increasing the capacity of a single MMC.

Whereas the exemplary embodiments by the present invention have been described in conjunction with an MMC, it is permissible to apply the present invention to various types of card systems connectable and communicable with a host and including a memory chip, for example, Secure Digital (SD) cards, USB memories, Compact Flash (CF) memories, and so on.

According to exemplary embodiments of the present invention as described above, the memory card is able to include pluralities of memory chips. Thus, it is easy to design a capacity of the memory card in various ways. Moreover, by using the same card ID of the plural MMCs coupled to the MMC bus, it is possible to obtain the same effect as in the case of increasing a capacity of a single MMC.

The above-disclosed subject matter is to be considered illustrative and not restrictive, and the appended claims are intended to cover all such modifications, enhancements, and other exemplary embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A memory card comprising:
a first memory chip responding to commands input externally that are relevant to reading, programming, and erasing operations with data; and
a second memory chip responding to commands input externally that are relevant to reading, programming, and erasing operations with data,
wherein card identification (ID) information is stored in the first memory chip and the second memory chip, wherein the card ID information includes capacity information corresponding to a sum of sizes of the first and second memory chips, wherein the first memory chip includes a first flash memory, and a first controller operating to control the first flash memory, and wherein the second memory chip includes a second flash memory and a second controller operating to control the second flash memory, wherein only one of the memory chips is set as a primary and only the memory chip set as primary additionally responds to a command input externally for card identification.

2. The memory card as set forth in claim 1, wherein the first flash memory comprises:
   a memory cell array; and
   a peripheral block configured to control reading, programming, and erasing operations of the memory cell array by the first controller.

3. The memory card as set forth in claim 2, wherein the memory cell array of the first flash memory stores the card identification information.

4. The memory card as set forth in claim 3, wherein the first controller comprises a register for storing the card identification information read out by the peripheral block at a power-up time.

5. The memory card as set forth in claim 4, wherein the first controller of the first memory chip outputs the card identification information externally of the memory card in response to a command input externally.

6. The memory card as set forth in claim 2, wherein the memory card is a multimedia card.

7. The memory card as set forth in claim 6, wherein the first controller comprises:
   a CPU;
   a host interface configured to communicate externally in a multimedia card interface mode under control of the CPU;
   a flash interface configured to control the peripheral block under control of the CPU; and
   a buffer RAM connected between the host interface and a flash interface and configured to temporarily store transmission data.

8. The memory card as set forth in claim 1, wherein the second flash memory comprises:
   a memory cell array; and
   a peripheral block configured to control reading, programming, and erasing operations of the memory cell array by the second controller.

9. The memory card as set forth in claim 8, wherein the memory cell array of the second flash memory stores the card identification information.

10. The memory card as set forth in claim 9, wherein the second controller of the second memory chip comprises a register for storing the card identification information read out by the peripheral block at a power-up time.

11. The memory card as set forth in 1, wherein the second controller comprises:
    a CPU;
    a host interface configured to communicate externally in a multimedia card interface mode under control by the CPU;
    a flash interface configured to control the peripheral block under control by the CPU; and
    a buffer RAM connected between the host interface and flash interface and configured to temporarily store transmission data.

12. A memory system comprising:
    a host; and
    a multimedia card configured to communicate with the host,
    wherein the multimedia card comprises:
    a first memory chip responding to commands input from the host that are relevant to reading, programming, and erasing operations with data; and
    a second memory chip responding to commands input from the host relevant to writing and reading operations with data,
    wherein card identification (ID) information is stored in the first memory chip and the second memory chip, wherein the card ID information includes capacity information corresponding to a sum of sizes of the first and second memory chips,
    wherein the first memory chip includes a first flash memory, and a first controller operating to control the first flash memory, and
    wherein the second memory chip includes a second flash memory and a second controller operating to control the second flash memory,
    wherein only one of the memory chips is set as a primary and only the memory chip set as primary additionally responds to a command input externally for card identification.

13. The memory system as set forth in claim 12, wherein the flash memory comprises:
    a memory cell array; and
    a peripheral block configured to control reading, programming, and erasing operations of the memory cell array by the controller.

14. The memory system as set forth in claim 13, wherein the memory cell array stores the card identification information.

15. The memory system as set forth in claim 14, wherein the controller comprises a register for storing the card identification information read out by the peripheral block at a power-up time.

16. The memory system as set forth in claim 15, wherein the host provides the multimedia card with a command for reading the card identification information in a card identification mode and the first memory chip of the multimedia card outputs the card identification information to the host in response to the read command provided from the host.

17. The memory system as set forth in claim 12, wherein the controller comprises a ROM storing firmware to control the flash memory.

18. The memory system as set forth in claim 12, wherein the host provides the multimedia card with an address while accessing the multimedia card.

19. The memory system as set forth in claim 18, wherein the controller operates to control access to a memory cell array corresponding to the address if the address provided from the host belongs to a first address group.

20. The memory system as set forth in claim 19, wherein the controller operates to control access to a memory cell array corresponding to the address if the address provided from the host belongs to a second address group.

21. The memory system as set forth in claim 20, wherein the first address group includes odd-ordered addresses and the second address group includes even-ordered addresses.

22. A method of operating a memory system having a host and a multimedia card including first and second memory chips, the method comprising:
    connecting the multimedia card to the host, wherein only one of the memory chips is set as primary;

transferring card identification (ID) information to the host only from the memory chip of the multimedia card set as primary in response to a command input from the host for card identification; and executing a reading, programming, or erasing operation of at least one of the first and second memory chips under control by the host, wherein the card ID information is stored in the first memory chip and the second memory, wherein the card ID information includes capacity information corresponding to a sum of sizes of the first and second memory chips, wherein the first memory chip responds to commands input externally that are relevant to reading, programming, and erasing operations with data and includes a first flash memory, and a first controller operating to control the first flash memory, and wherein the second memory chip responds to commands input externally that are, relevant to reading, programming, and erasing operations with data and includes a second flash memory and a second controller operating to control the second flash memory.

23. The method as set forth in claim 22, wherein each of the first and second memory chips is a flash memory chip.

24. The method as set forth in claim 22, further comprising: providing the flash memory with an address provided from the host.

25. The method as set forth in claim 24, wherein the first memory chip executes the reading, programming, or erasing operation if the address provided from the host belongs to a first address group.

26. The method as set forth in claim 25, wherein the second memory chip executes the reading, programming, or erasing operation if the address provided from the host belongs to a second address group.

27. The method as set forth in claim 26, wherein the first address group includes odd-ordered addresses and the second address group includes even-ordered addresses.

28. A memory system comprising:
a host; and
a multimedia card bus coupled to the host,
a first multimedia card communicating with the host through the multimedia card bus and responding to commands input from the host that are relevant to reading, programming, and erasing operations with data; and
a second multimedia card responding to commands input from the host that are relevant to writing and reading operations with data and communicating with the host through the multimedia card bus,
wherein card identification (ID) information is stored in the first multimedia card and the second multimedia card, wherein the card ID information includes capacity information corresponding to a sum of sizes of the first and second multimedia cards,
wherein the first multimedia card includes a first flash memory, and a first controller operating to control the first flash memory, and
wherein the second multimedia card includes a second flash memory and a second controller operating to control the second flash memory,
wherein only one of the multimedia cards is set as a primary and only the multimedia card set as primary additionally responds to a command input from the host for card identification.

29. The memory card of claim 1, wherein each of the memory chips transfer the card ID information from their flash memories to their respective controllers at a power-up time, but only the memory chip set as the primary transfers the card ID information from its controller to an external host at the power-up time.

30. The memory card of claim 1, wherein the first controller includes a first register and the second controller includes a second register, wherein at the power-up time, the card ID information is transferred from the first flash memory to the first register, the card ID information is transferred from the second flash memory to the second register, and the card ID information is only transferred from the register to an external host of the memory chip set as primary.

31. The memory system of claim 12, wherein each of the memory chips transfer the card ID information from their flash memories to their respective controllers at a power-up time, but only the memory chip set as the primary transfers the card ID information from its controller to the host at the power-up time.

32. The memory system of claim 12, wherein the first controller includes a first register and the second controller includes a second register, wherein at the power-up time, the card ID information is transferred from the first flash memory to the first register, the card ID information is transferred from the second flash memory to the second register, and the card ID information is only transferred from the register to the host of the memory system set as primary.

33. The method as set forth in claim 22, wherein each of the memory chips transfer the card ID information from their flash memories to their respective controllers at a power-up time, but only the memory chip set as the primary transfers the card ID information from its controller to the host at the power-up time.

34. The method as set forth in claim 22, wherein the first controller includes a first register and the second controller includes a second register, wherein at the power-up time, the card ID information is transferred from the first flash memory to the first register, the card ID information is transferred from the second flash memory to the second register, and the card ID information is only transferred from the register to the host of the memory chip set as primary.

35. The method as set forth in claim 28, wherein each of the multimedia cards transfer the card ID information from their flash memories to their respective controllers at a power-up time, but only the multimedia card set as the primary transfers the card ID information from its controller to the external host at the power-up time.

36. The method as set forth in claim 28, wherein the first controller includes a first register and the second controller includes a second register, wherein at the power-up time, the card ID information is transferred from the first flash memory to the first register, the card ID information is transferred from the second flash memory to the second register, and the card ID information is only transferred from the register to the host of the multimedia card set as primary.

* * * * *